United States Patent [19]

Samarov

[11] Patent Number: 5,428,891
[45] Date of Patent: Jul. 4, 1995

[54] METHOD OF MAKING AN ELECTRICAL INTERCONNECT DEVICE

[75] Inventor: Victor M. Samarov, Carlisle, Mass.

[73] Assignee: Digital Equipment Corporation, Maynard, Mass.

[21] Appl. No.: 893,220

[22] Filed: Jun. 2, 1992

[51] Int. Cl.⁶ .......................................... H01R 43/00
[52] U.S. Cl. ...................................... 29/885; 264/135
[58] Field of Search ..................... 29/885; 439/86, 91; 264/135; 427/123

[56] References Cited

U.S. PATENT DOCUMENTS

| | | | |
|---|---|---|---|
| 2,193,294 | 3/1940 | Osenberg | 29/885 |
| 3,579,206 | 5/1971 | Grange. | |
| 3,747,210 | 7/1973 | Kroll | 29/885 |
| 3,924,915 | 12/1975 | Conrad. | |
| 3,967,162 | 6/1976 | Ceresa et al.. | |
| 4,556,266 | 12/1985 | Sonobe | 361/412 |
| 4,686,607 | 8/1987 | Johnson | 361/413 |
| 4,691,091 | 9/1987 | Lyons et al. | 219/121 LM |
| 4,734,045 | 3/1988 | Hawkins | 439/79 |
| 4,812,353 | 3/1989 | Yumoto | 264/135 |
| 4,850,883 | 7/1989 | Kabadi | 439/67 |
| 4,858,313 | 8/1989 | Bowlin | 29/885 |
| 5,037,311 | 8/1991 | Frankeny et al. | 439/66 |
| 5,073,124 | 12/1991 | Powell | 439/197 |

Primary Examiner—P. W. Echols
Attorney, Agent, or Firm—James F. Thompson; Ronald C. Hudgens

[57] ABSTRACT

This invention relates to a method by which an electrical interconnect device is manufactured. In the preferred embodiment of the invention, the geometric dimensions of the device and its necessary electrical characteristics are determined by reference to the components which the device is going to interconnect. An electrically conductive skin thickness, which will achieve the necessary electrical requirements of the application, is also determined. That conductive skin is then selectively formed over an electrically non-conductive core, which is constructed in accordance with the geometric requirements and electrical operating properties of the application, but which is deliberately undersized by the thickness of the skin. Thus, when the skin is formed over the undersized core, the skin thickness causes the final device produced by the process to meet both the electrical and geometric requirements of the application.

16 Claims, 6 Drawing Sheets

| f (Hz) | 10 | 20 | 30 | 40 | 50 | 60 | 70 | 80 | 90 |
|---|---|---|---|---|---|---|---|---|---|
| d(mil) | 822 | 581 | 475 | 411 | 368 | 336 | 311 | 291 | 274 |

| f (Hz) | 100 | 200 | 300 | 400 | 500 | 600 | 700 | 800 | 900 |
|---|---|---|---|---|---|---|---|---|---|
| d(mil) | 260 | 184 | 150 | 130 | 116 | 106 | 98.3 | 91.9 | 86.7 |

| f (Khz) | 1.00 | 2.00 | 3.00 | 4.00 | 5.00 | 6.00 | 7.00 | 8.00 | 9.00 |
|---|---|---|---|---|---|---|---|---|---|
| d(mil) | 82.2 | 58.1 | 47.5 | 41.1 | 36.8 | 33.6 | 31.1 | 29.1 | 27.4 |

| f (Khz) | 10.0 | 20.0 | 30.0 | 40.0 | 50.0 | 60.0 | 70.0 | 80.0 | 90.0 |
|---|---|---|---|---|---|---|---|---|---|
| d(mil) | 26.0 | 18.4 | 15.0 | 13.0 | 11.6 | 10.6 | 9.83 | 9.19 | 8.67 |

| f (Khz) | 100 | 200 | 300 | 400 | 500 | 600 | 700 | 800 | 900 |
|---|---|---|---|---|---|---|---|---|---|
| d(mil) | 8.22 | 5.81 | 4.75 | 4.11 | 3.68 | 3.36 | 3.11 | 2.91 | 2.74 |

| f (Mhz) | 1.00 | 2.00 | 3.00 | 4.00 | 5.00 | 6.00 | 7.00 | 8.00 | 9.00 |
|---|---|---|---|---|---|---|---|---|---|
| d(mil) | 2.60 | 1.84 | 1.50 | 1.30 | 1.16 | 1.06 | 0.98 | 0.92 | 0.87 |

| f (Mhz) | 10.0 | 20.0 | 30.0 | 40.0 | 50.0 | 60.0 | 70.0 | 80.0 | 90.0 |
|---|---|---|---|---|---|---|---|---|---|
| d(mil) | 0.82 | 0.58 | 0.47 | 0.41 | 0.37 | 0.34 | 0.31 | 0.29 | 0.27 |

FIG. 5

METHOD OF MAKING AN ELECTRICAL INTERCONNECT DEVICE

FIELD OF THE INVENTION

This invention relates to a method of making an electrical interconnect device, and more particularly the invention relates to a method which is useful for making interconnect devices with non standard dimensions.

BACKGROUND OF THE INVENTION

There are many components in modern electronic equipment which require electrical interconnect devices. An electrical interconnect device is used to establish a conductive path by which one electronic component is coupled with another. For example, a miniature transformer may be connected to a mother board through an electrical interconnect device. In such interconnection arrangements, the geometric dimensions and the electrical characteristics of the device must be matched with the geometric and electrical requirements of the components that are being connected. The geometric requirements relate to the size and configuration of the device, while the electrical requirements relate to the current, frequency, and impedance of the device, for example.

In many applications, standard electrical connectors can be used because connector manufacturers offer a wide range of components that are suitable for a wide variety of applications. On the other hand, the standard electrical interconnect devices that are available are not always suitable for a given application. Therefore, it is sometimes necessary for a non-standard interconnect device to be customized for the given application.

The customized, or non-standard production of an interconnect device can be quite expensive. This is particularly so when it is not anticipated that a large volume of units will be produced because, in such instances, the tooling and production costs are spread over only a relatively small number. Consequently, the cost of a non-standard interconnect device can be prohibitively high in cases in which a small number of devices are needed.

SUMMARY OF THE INVENTION

The present invention relates to a method of making an electrical interconnect device. Although the method can be employed to manufacture any number of units, the relatively low cost of implementing the manufacturing method makes it particularly well suited to the manufacture of non-standard interconnect devices in volumes which do not economically justify expensive tooling or assembly automation. In other words, the method can be applied in instances in which a relatively small number of devices are needed, and the cost of traditional design and tooling would be prohibitively high.

An interconnect device is used to electrically couple conductive elements, such as the contact pads on a printed circuit board with a number of conductive sleeves on another board. The method by which the device is manufactured focuses upon the necessary electrical properties of the interconnect device, as well as its geometric dimensions. Using these factors, the method determines the overall geometric dimensioning of the device, as well as the thickness of a conductive skin. The skin is then formed over a plastic core, which has the desired geometric characteristics of the interconnect device, except that it is deliberately undersized by the thickness of the conductive skin. Therefore, when the conductive skin is formed over the plastic core, the interconnect device resulting from the process will have the necessary electrical and geometric properties to suit the application.

An object of the invention is to employ a method by which electrical interconnect devices, especially non-standard interconnect devices, can be manufactured inexpensively. A feature of the invention is to use a core construction process, such as plastic injection molding, which is less costly than the metal fabrication process through which solid metal connectors are manufactured. The process produces a plastic core over which is formed a conductive metal skin. An advantage of the present invention is the production of an inexpensive interconnect device that has geometric and electrical characteristics properly matched with the requirements of a particular application.

Other objects, features, and advantages of the invention will be further appreciated and better understood upon consideration of the following detailed description of the preferred embodiment, presented in conjunction with the accompanying drawings.

BRIEF DESCRIPTION OF THE DRAWINGS

FIG. 5 is a table illustrating the skin effect phenomenon for interconnect devices made of copper (Cu) operating at different frequencies.

DETAILED DESCRIPTION OF THE PREFERRED EMBODIMENT

Figure 1:
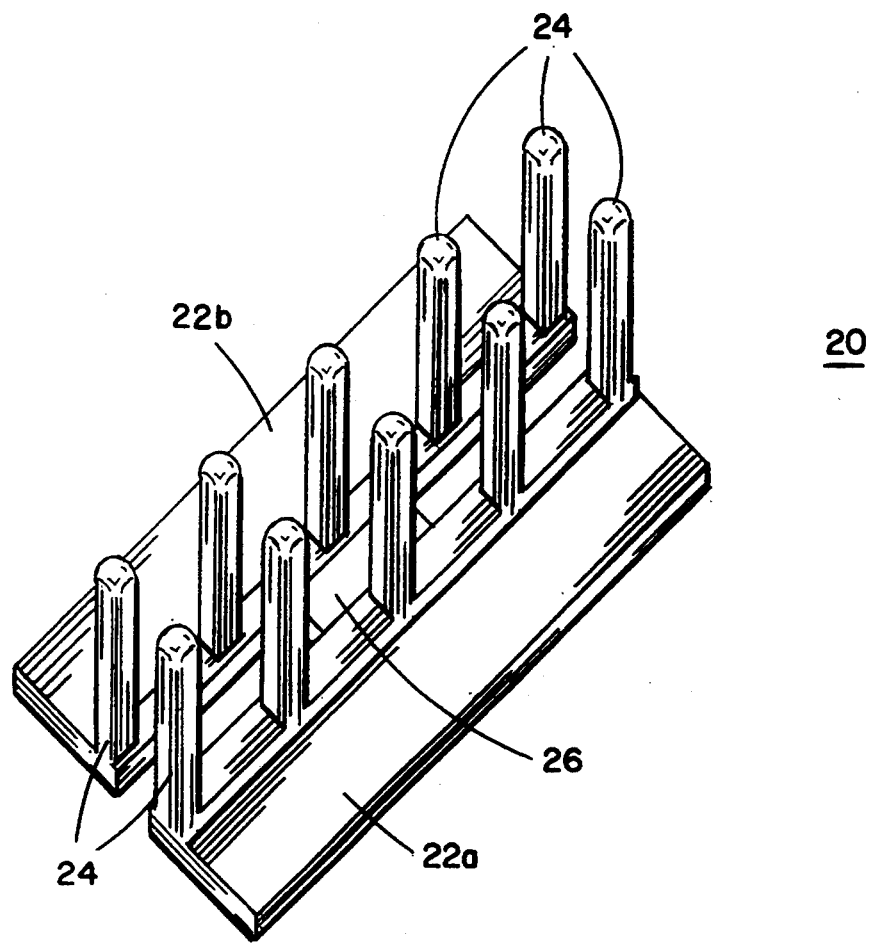
FIG. 1 is an isometric view of an interconnect device produced in accordance with an embodiment of the present invention.

Referring first to FIG. 1, an interconnect device 20 manufactured in accordance with the preferred embodiment of the method of the present invention is shown in an isometric view. In this particular embodiment, device 20 is a single piece, accurate geometry interconnect element. Although the present invention can be applied to the manufacture of interconnect devices which are mass produced, it is especially suitable when the dimensions of device 20 are "non-standard", meaning that the device is not available as a standard, mass produced, electrical component. Rather, non-standard components are ones which must be custom made, often in relatively small volumes.

As shown in FIG. 1, device 20 has two generally identical bases 22a, 22b with each having five generally identical pins 24 projecting orthogonally upward. In the particular configuration shown, the two bases 22a, 22b and their pins 24 are generally identical with each other such that device 20 would be symmetrical about a plane dividing device 20 down the center. Also as shown in FIG. 1, bases 22a, 22b are connected together by bridge 26.

Although bridge 26 physically connects bases 22a, 22b together, in this particular embodiment it also electrically insulates them from one another. As will be detailed below, the center of device 20 is comprised of a high heat deflection-temperature, non-electrically conductive plastic core onto which an electrically conductive skin is formed. Although the core and skin are not distinguishable in FIG. 1, in FIGS. 3A and 3B, the plastic core is designated by reference numeral 56 and the skin is designated by reference numeral 60. Both will be discussed in greater detail below.

Referring back to FIG. 1, given that the core of device 20 is a plastic, non-conductive material, the electrical insulation of bridge 26 is accomplished by selectively forming the skin over the surface of the core. In the embodiment shown, during the process by which the conductive skin is formed over the plastic core, bridge 26 would not be coated with the conductive skin, resulting in no conductive path being available between bases 22a, 22b. In other embodiments of the invention, device 20 could likewise be selectively formed with the conductive skin so that certain, individual pins 24 on a given base 22a, 22b are electrically isolated from other pins 24 on the same base. Such adaptations could easily be made in order to accommodate the particular interconnect configuration necessary for a given application.

Figure 2:
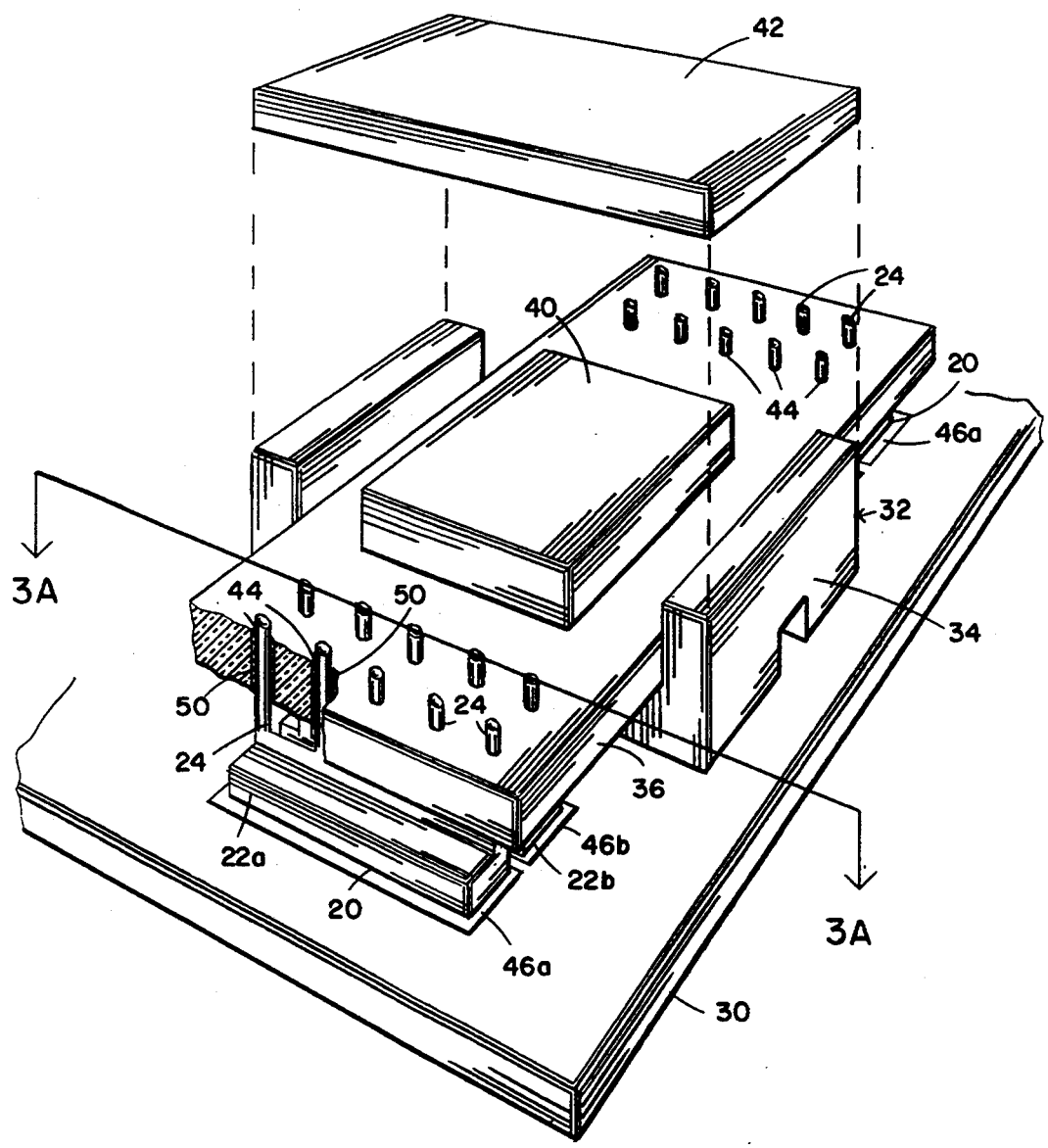
FIG. 2 is an isometric, partly sectioned and partly exploded view of a transformer coupled to a printed circuit board by means of the interconnect device of FIG. 1.

FIG. 2 shows a particular application in which device 20 of FIG. 1 is used. FIG. 2 actually includes two devices 20, with the one in the foreground of the illustration being visible with a greater amount of detail.

FIG. 2 includes a portion of a printed circuit board 30 onto which is mounted transformer 32, which is a miniature, surface mountable transformer. As shown in FIG. 2, transformer 32 includes a ferrite core 34 on which is mounted transformer windings board 36, with core stud 40 of core 34 projecting through the center. As suggested by the dashed lines of the partly exploded view, when fully assembled the transformer is covered with core lid 42.

As shown in its partly sectioned portion, windings board 36 has a number of contact holes 44 for the insertion of pins 24. Although windings board 36 is generally comprised of an insulative material, such as a glass epoxy composite, formed within each hole 44 is a contact sleeve 50 which is an electrical conductor, each of which is respectively connected to the circuitry of windings board 36. Accordingly, contact sleeve 50 is the electrical conductor through which transformer 32 is coupled to other electronic components, in this instance printed circuit board 30. In order to establish the electrical connection between windings board 36 and printed circuit board 30, interconnect device 20 is used.

As shown in FIG. 2, printed circuit board 30 has contact pads 46a, 46b, which are the electrical contact elements connected to the circuitry of printed circuit board 30. As will be discussed in greater detail below in connection with FIG. 3A, during assembly, after a given pin 24 is inserted into its sleeve 50, it is typically electrically and physically coupled to its respective plated sleeve 50 by means of a solder bond. Likewise, each base 22a, 22b is electrically and physically coupled to its respective contact pad 46a, 46b by means of a solder bond, the solder bonds being made by reflowing predeposited solder paste when heated in a reflow chamber, for example.

Figure 3A:
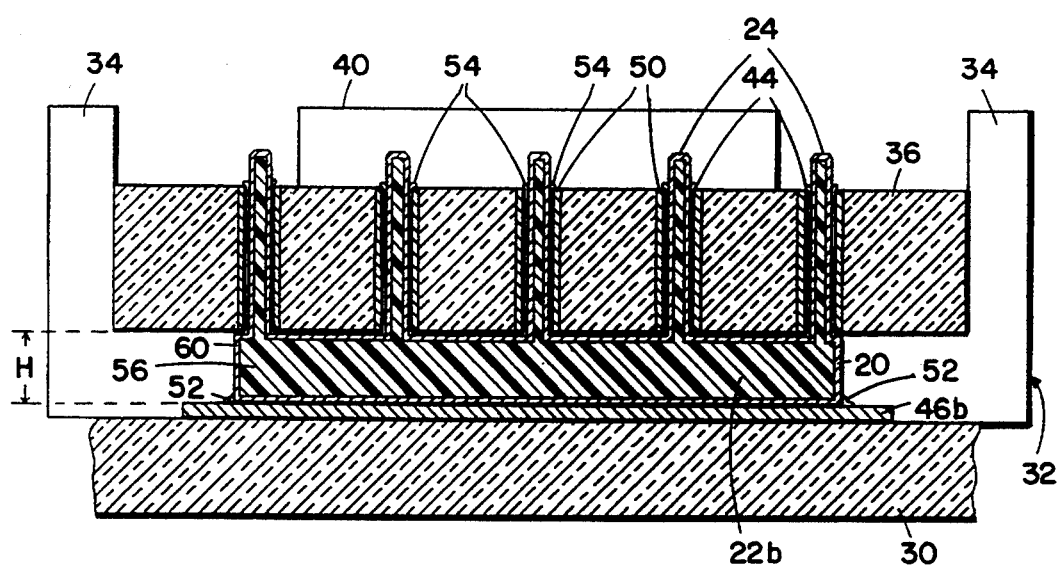
FIG. 3A is a side sectional view of the transformer, printed circuit board, and interconnect device of FIG. 2, sectioned by a plane running vertically through Line 3A—3A of FIG. 2.

As seen in FIG. 2, in order for device 20 to function in a given application, such as interconnecting windings board 36 to printed circuit board 30, a number of factors must be addressed. Firstly, the geometry of device 20 must be configured so that the pins 24 fit within their respective holes 44 within a particular dimensional tolerance. Bases 22a, 22b must also be configured so that they fit on their respective contact pads 46a, 46b. Furthermore, the height (H) of device 20, as shown in FIG. 3A, must be suitable to accurately accommodate the distance between windings board 36 and contact pad 46b when transformer 32 is mounted on printed circuit board 30. In addition to its geometric characteristics, the necessary electrical requirements of the application of device 20 are also a significant factor in its design.

Referring now to FIG. 3A, a view of the transformer 32, printed circuit board 30, and interconnect device 20 of FIG. 2 sectioned by a plane running vertically through Line 3A—3A of FIG. 2 is provided. As seen, base 22b of device 20 is soldered to contact pad 46b of printed circuit board 30 by solder bond 52. Each pin 24 of device 20 is inserted in its respective hole 44 of windings board 36, and each pin 24 is electrically and physically coupled to sleeve 50 within a given hole 44 by means of solder bond 54. Although in the particular application shown in the drawings device 20 is solder bonded, the method of the present invention can also be used for making interconnect devices which are mated with corresponding connectors through a pressure or mechanical fit.

As seen through the side sectional view of FIG. 3A, device 20 has a core 56, which is comprised of a high heat deflection-temperature, electrically non-conductive plastic. For example, for core 56 it has been useful to use a polyetherimide resin, such as the Ultem 1000 series resin, manufactured by General Electric. Core 56 can be produced through a number of different processes, such as vacuum forming, stamping, or a heat forming process, such as injection molding. Also seen in the sectional view of FIG. 3A, formed over the surface of core 56 is a conductive skin 60, comprised of copper (Cu), for example, although other conductive materials are suitable as well. Likewise, skin 60 can be formed over core 56 through a number of different processes, such as electrolytic plating, electric arc spraying, or vapor deposition.

Figure 3B:
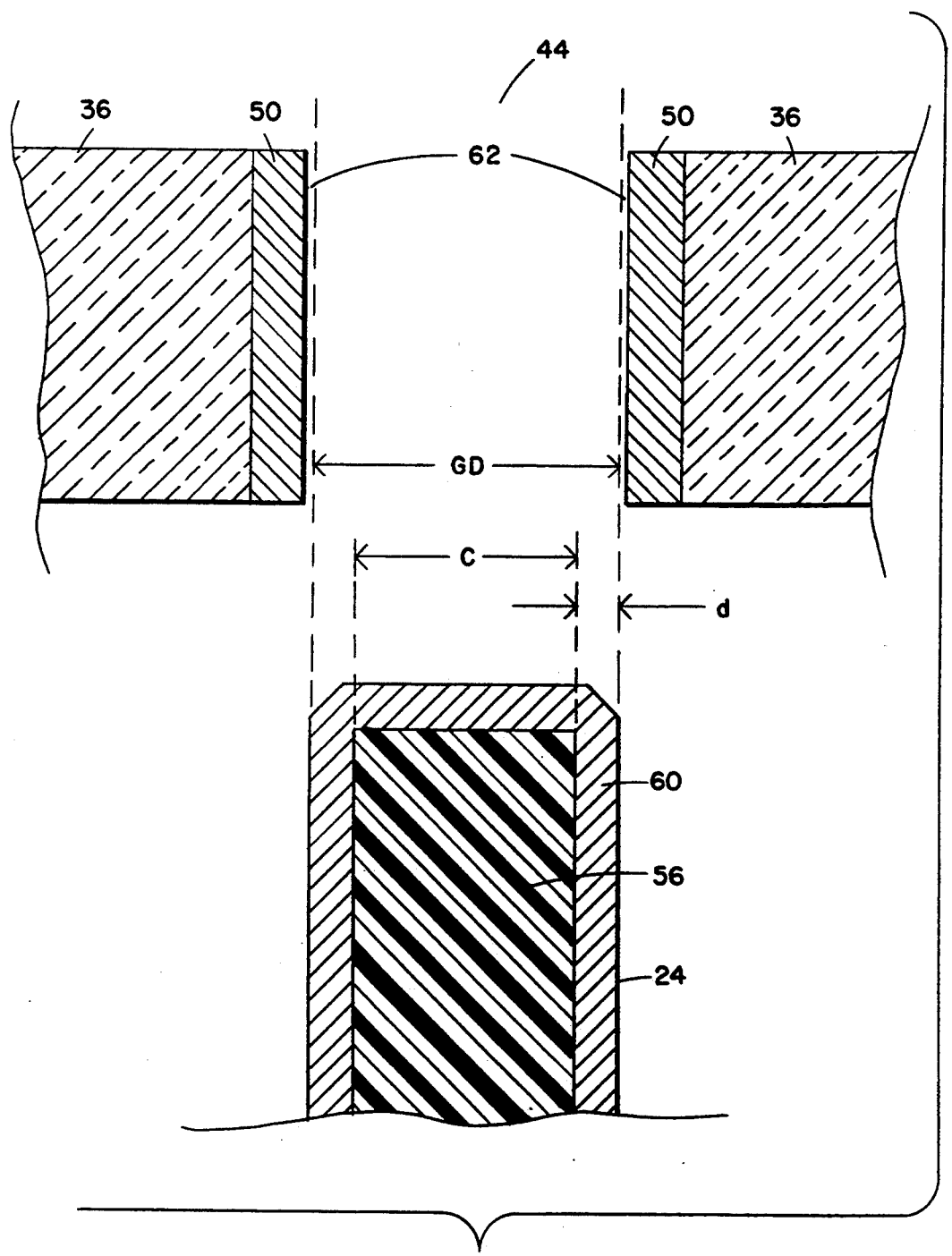
FIG. 3B is an exploded view of a portion of one pin and its corresponding hole as shown in FIG. 3A.

Referring now to FIG. 3B, a more detailed explanation of the method by which device 20 is constructed can be provided by referring to the fragmented, sectioned, and exploded view of one single pin 24 and its corresponding hole 44 in windings board 36. It should be noted that although the discussion of FIG. 3B focuses upon the geometry of pin 24 and its connection with sleeve 50 for purposes of illustration, the sizing method described applies to the manufacture of device 20 entirely, not just the pin portion. In other words, the discussion of the geometric dimensioning of pin 24 applies equally to the method by which the entire device 20 is constructed.

Shown within hole 44 on FIG. 3B is a geometric dimension, "GD", which is shown to correspond to pin 24. Although in the two dimensional rendering of FIG. 3B it appears that GD is simply the width of pin 24, GD is actually a more comprehensive dimension which accounts for the three dimensional, geometric shape and size of pin 24. This shape and size are dictated by the electrical operating properties of device 20, as well as the geometry and size of the electrical conductors with which pin 24 must mate. In this embodiment, the geometry is a hollowed, elongate hole formed by sleeve 50 in windings board 36, but in other embodiments it could be different.

Moreover, GD is a dimension which includes the actual dimensional tolerances to which pin 24 may be manufactured and still be suitable for mating with sleeve 50 in hole 44. As indicated by the dashed lines on FIG. 3B, pin 24 fits within hole 44 leaving a small space 62 around pin 24, which is the area into which solder 54 (not shown in FIG. 3B, but shown in FIG. 3A) will flow when pin 24 is soldered to sleeve 50. As noted above, in other applications pin 24 could be a pressure fit within hole 44. Nonetheless, even in such applications device 20 would still be manufactured in accordance with specific dimensional tolerances.

Still referring to FIG. 3B, pin 24 is comprised of plastic core 56 onto which conductive skin 60 is formed. As shown, core 56 of pin 24 has a geometric dimension "C", which, like dimension GD, is not simply the width of core 56 of pin 24, rather C implies a three dimensional size and geometric shape. Likewise C includes the appropriate dimensional tolerances. Formed over core 56 of pin 24 is skin 60 which has a thickness, or depth, "d". In this particular embodiment, given that through the skin forming process, skin 60 will assume the geometric configuration of core 56, d is a measure of the thickness of the conductive skin formed on core 56.

Although FIG. 3B shows the thickness, d, of skin 60 to be on only one pin 24, the thickness of skin 60 would be uniform over the entire surface of device 20, as shown in FIG. 3A, except in those areas where device 20 was selectively not plated, such as bridge 26, as discussed above in connection with FIG. 1. Also, as stated above, although the discussion of FIG. 3B is focused upon the matching of pins 24 with sleeves 50, the same approach discussed in connection with the construction of these elements would be used in connection with the construction of the entire device 20. For example, in the embodiment shown in FIG. 2 and 3A, bases 22a, 22b will have to be configured for mating connection with contact pads 46a, 46b. Such sizing would be accomplished in a manner similar to the sizing of pins 24 with sleeves 50 to achieve an accurate vertical dimension of base 22b to match the distance, H, (shown on FIG. 3A) between pad 46b and windings board 36. Therefore, more generally in accordance with the method of the present invention, GD represents the geometric dimension of the entire device 20; C represents the geometric dimension of the entire core 56; and d represents the thickness of skin 60 selectively formed over core 56.

Figure 4:
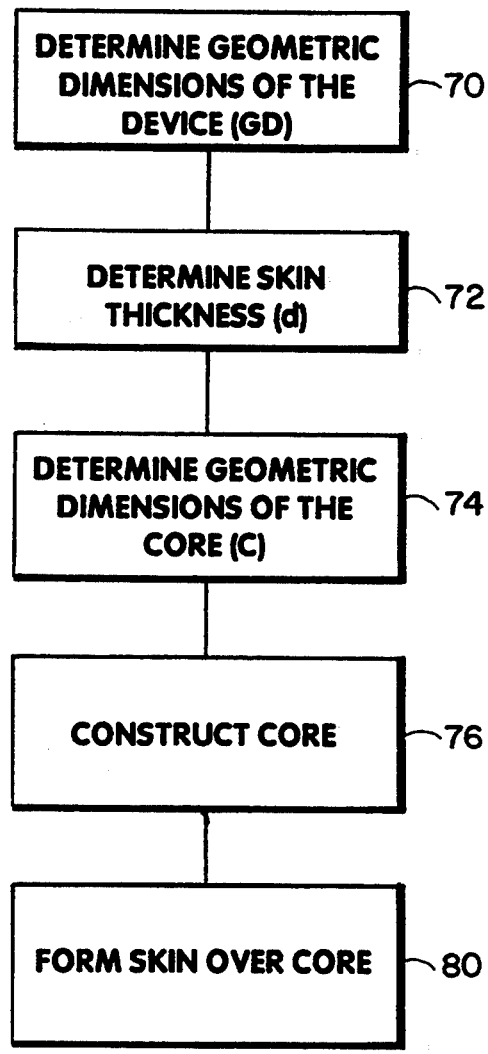
FIG. 4 is a flow diagram showing the steps of an embodiment of the present invention.

Referring now to FIG. 4, a flow diagram is provided to show the process by which a device 20 is constructed in accordance with the present invention. The process commences in block 70 with the determination of the geometric dimensions of the device. GD will be dictated by the both the geometry and spacing of the conductive elements which device 20 must couple together, and the electrical requirements of the application of device 20. With respect to the geometry of device 20, in FIG. 2, device 20 couples together contact pads 46a, 46b with sleeves 50 which are in a spaced relation to one another. Accordingly, GD will be determined, in part, by reference to the geometric configuration of contact pads 46a, 46b and sleeves 50, as well as the distances separating printed circuit board 30 from windings board 36 when the two are mounted together.

In addition to the geometric factors, GD is determined by the electrical requirements of device 20 in order for it to successfully interconnect printed circuit board 30 with transformer 32. For example, the voltage drop tolerated over the path of the current through device 20, the current value itself, the resistivity of skin 60, the environmental temperature at which device 20 operates, the material composition of skin 60, and the frequency of operation of device 20, are all factors which affect GD. These factors and their influence on GD are well known to those skilled in the interconnect device manufacturing art.

The process next moves to block 72 in which the skin thickness, d, is determined by reference to the material composition of the skin, as well as the frequency at which device 20 operates. As is known to those skilled in the manufacturing of interconnect devices, the frequency at which a given device operates determines the degree to which electrons in the central portion of the conductor will actually conduct electricity. In other words, when a given device operates at a low frequency there is a much higher degree of electrical conduction in the central portion of the conductor, than when that conductor operates at a high frequency. During high frequency operation conduction is more limited to the outside of the conductor, a phenomenon known as the "skin" effect.

FIG. 5 provides a table showing the skin effect for copper (Cu), for example, with the frequency given in Hertz (Hz, kHz, or MHz), and the depth of electrical conduction beneath the surface of the conductor being given in 1/1000 of an inch (mils). Referring to the first and last entries on the table of FIG. 5, the skin effect phenomenon can be seen. At a frequency of 10 Hz, electrical conduction will take place down to a depth of 822 mils below the surface of the conductor, while at a frequency of 90 MHz electrical conduction penetrates to a depth of only 0.27 mils. Accordingly, the higher the frequency, the thinner the "skin" on the conductor which conducts the electricity. By way of example, in the application of device 20, shown in FIG. 2, it operate at frequencies above 50 kHz, with preferred ranges between 50 kHz–1 MHz.

The skin effect factors into the method of the present invention because the skin effect will determine how deeply electrical conduction will occur below the surface of interconnect device 20 once the skin composition and frequency of operation is determined. Thus, the thickness, d, of skin 60 can be matched with the thickness dictated by the skin effect to ensure that the conductive skin 60 is thick enough to have the necessary electrical conduction characteristics suitable for the application. On the other hand, any skin 60 thickness which is greater than the thickness dictated by the skin effect would largely be superfluous since no appreciable conduction would occur below the thickness determined by the skin effect.

With GD and d determined, the geometric dimension of C can then be determined, as indicated by block 74, using the equation: $C = GD - d$. Stated in non-mathematical terms, with GD determined by the geometric and electrical requirements of the application of device 20, and with d determined in accordance with the electrical requirements of the application of device 20, C is deliberately undersized so that when skin 60 is formed over core 56, the final, outer, geometry of device 20 is dimensionally proper for the given application. In addition, because GD and d are designed in accordance with the electrical and geometric requirements of the application, when core 56 is covered with skin 60, device 20 will operate as a suitable conductor in the given application.

Having determined the proper dimensions for GD, d, and C, as discussed above, the process next actually constructs the core 56, as shown in block 76, and finally in block 80 skin 60 is formed over core 56 to produce the final device 20. As indicated above, the construction of core 56 and the formation of skin 60 can be accomplished using a number of known processes.

Although the present invention has been described in connection with the coupling of a transformer windings board with a printed circuit board, it will be clear to those skilled in the art that the invention has much wider application. The method allows device 20 to be custom designed to interconnect a wide variety of electrical components. This is especially true given that the core of the device can be made through a number of processes, such as plastic injection molding for example, which greatly increases the number of device variations to which the method of the present invention may be economically applied, especially when a particular device will be made in only low volumes.

Accordingly, the invention in its broader aspects is not limited to the specific details, representative apparatus, and illustrative examples shown and described herein. Thus, departures may be made from such details without departing from the spirit or scope of the invention.

What is claimed is:

1. A method of making a device for interconnecting two electrical components in a given application, the method comprising the steps of:

determining the necessary geometric dimensions of the device on the basis of the application;

determining an electrically conductive skin thickness on the basis of the frequency at which the device operates in the application;

constructing an electrically non conductive core, geometrically dimensioned such that with the conductive skin, having the determined skin thickness, formed over the core, the device will have the determined geometric dimensions; and forming the skin of the determined thickness skin over the core.

2. The method of claim 1 wherein said constructing step comprises injection molding the core.

3. The method of claim 2 wherein said injection molding uses plastic.

4. The method of claim 1 wherein said forming step comprises selectively coating the core with the skin so that a portion of the device is electrically insulated from another portion of the device.

5. The method of claim 4 wherein said forming step comprises electrolytically plating the core with the skin.

6. A method of making a device for interconnecting a first electrical component which is configured for being mounted in spaced relation to a second electrical component, the first and second components each having a conductive element, said method comprising the steps of:

determining the necessary geometric dimensions of the device on the basis of the geometry and spacing of the two components and the electrical requirements of the application of the device;

determining an electrically conductive skin thickness on the basis of the frequency at which the device operates in the application;

constructing an electrically non conductive core, geometrically dimensioned such that with a conductive skin of the determined thickness formed over the core, the device will have the determined geometric dimensions; and forming the skin of the determined thickness over the core.

7. The method of claim 6 wherein said constructing step comprises injection molding the core.

8. The method of claim 7 wherein said injection molding uses plastic.

9. The method of claim 6 wherein said forming step comprises selectively coating the core with the skin so that a portion of the device is electrically insulated from another portion of the device.

10. The method of claim 9 wherein said forming step comprises electrolytically plating the core with the skin.

11. The method of claim 6 further comprising the step of:

bonding the device to the conductive elements of the first and second components.

12. The method of claim 11 wherein said bonding step comprises soldering.

13. A method of making a device for interconnecting a first electrical component which is configured for being mounted in spaced relation with a second electrical component, the first and second components each having a conductive element to be interconnected by the device, said method comprising the steps of:

determining the necessary geometric dimensions of the device in order for the device to matingly interconnect the conductive elements of the first and second components with the first component mounted in relation to the second component, the geometric dimensions being determined by the geometry and spacing of the first and second components, and the electrical requirements of the application;

determining an electrically conductive skin thickness for the device by reference to the material composition of the skin and the frequency at which the device operates;

constructing an electrically non-conductive core, geometrically dimensioned such that with the skin, having the determined thickness, formed over the core, the device will have the determined, geometric dimensions; and forming the skin over the core.

14. The method of claim 13 wherein said constructing step comprises injection molding the core.

15. The method of claim 14 wherein said injection molding uses plastic.

16. The method of claim 13 wherein said forming step comprises selectively coating the core with the skin so that a portion of the device is electrically insulated from another portion of the device.

* * * * *